(12) United States Patent
Huang

(10) Patent No.: US 7,060,551 B2
(45) Date of Patent: Jun. 13, 2006

(54) METHOD OF FABRICATING READ ONLY MEMORY AND MEMORY CELL ARRAY

(75) Inventor: Chong-Jen Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 75 days.

(21) Appl. No.: 10/710,094

(22) Filed: Jun. 18, 2004

(65) Prior Publication Data

US 2005/0282336 A1    Dec. 22, 2005

(51) Int. Cl.
*H01L 21/76*    (2006.01)
(52) U.S. Cl. ............... 438/218; 438/225; 438/258; 438/294; 438/301; 438/303; 438/439
(58) Field of Classification Search ............... 438/218, 438/225, 258, 294, 297, 301, 303, 404, 439, 438/FOR. 189, FOR. 395
See application file for complete search history.

(56) References Cited

U.S. PATENT DOCUMENTS 6,391,722 B1 *  5/2002  Koh ..................... 438/264
6,531,733 B1 *  3/2003  Jang ..................... 257/315
6,569,736 B1 *  5/2003  Hsu et al. ............... 438/267
6,713,336 B1 *  3/2004  Shin et al. ............... 438/201
6,780,695 B1 *  8/2004  Chen et al. .............. 438/202
2002/0001891 A1 *  1/2002  Kim et al. ............... 438/197

* cited by examiner

*Primary Examiner*—George Fourson
*Assistant Examiner*—Joannie Adelle Garcia
(74) *Attorney, Agent, or Firm*—Jiang Chyun IP Office

(57) ABSTRACT

A method of fabricating a read only memory cell array is described. A patterned film is formed over the substrate to define the predetermined positions of bit lines on the substrate and exposing a plurality of predetermined portions of the substrate. A plurality of field oxide layers is formed on the exposed portions of the substrate to define the positions of channels. After removing the patterned film, ions are implanted into the substrate to form the bit lines by using the field oxide layer as implanting mask. The field oxide layer is removed to form several recesses on the substrate. Thereafter, a gate insulating layer and word lines are formed over the substrate, and the recess channels are formed underneath the gate-insulating layer. The length of the recess channel is large enough to reduce the short channel effect.

16 Claims, 6 Drawing Sheets

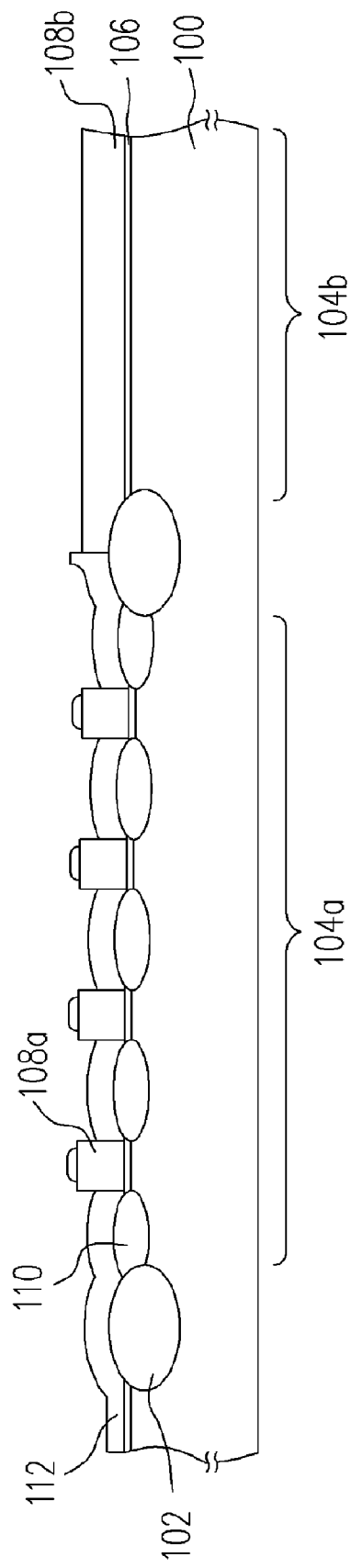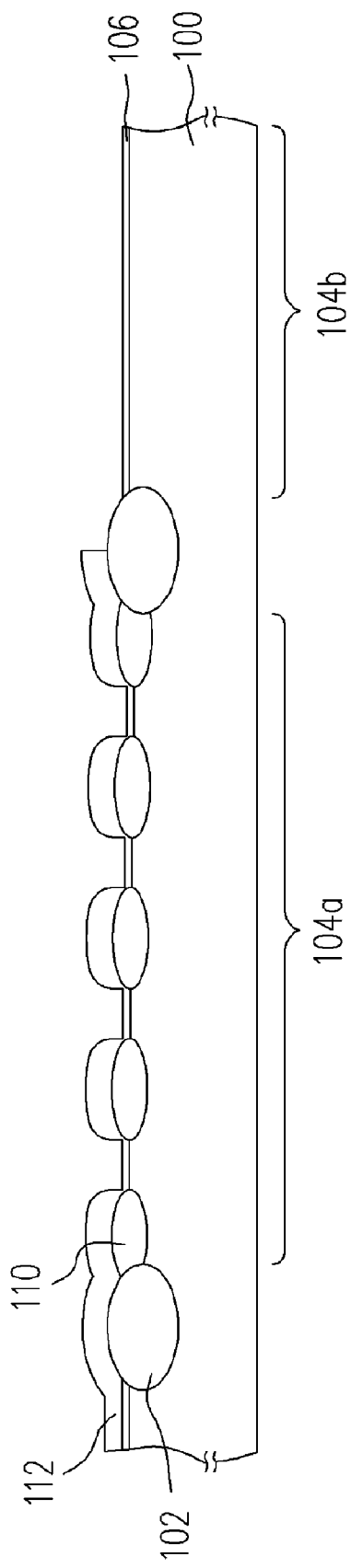

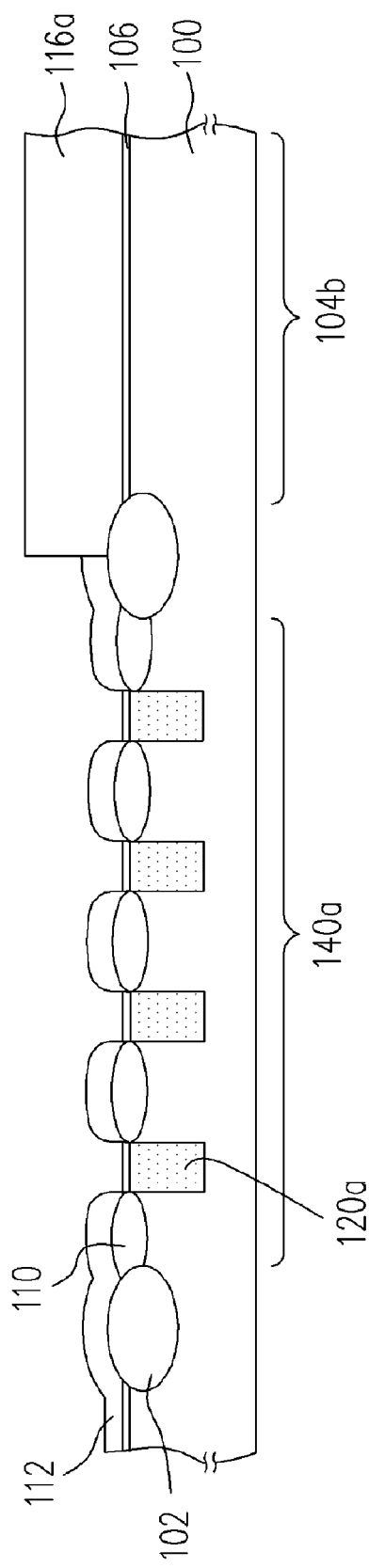
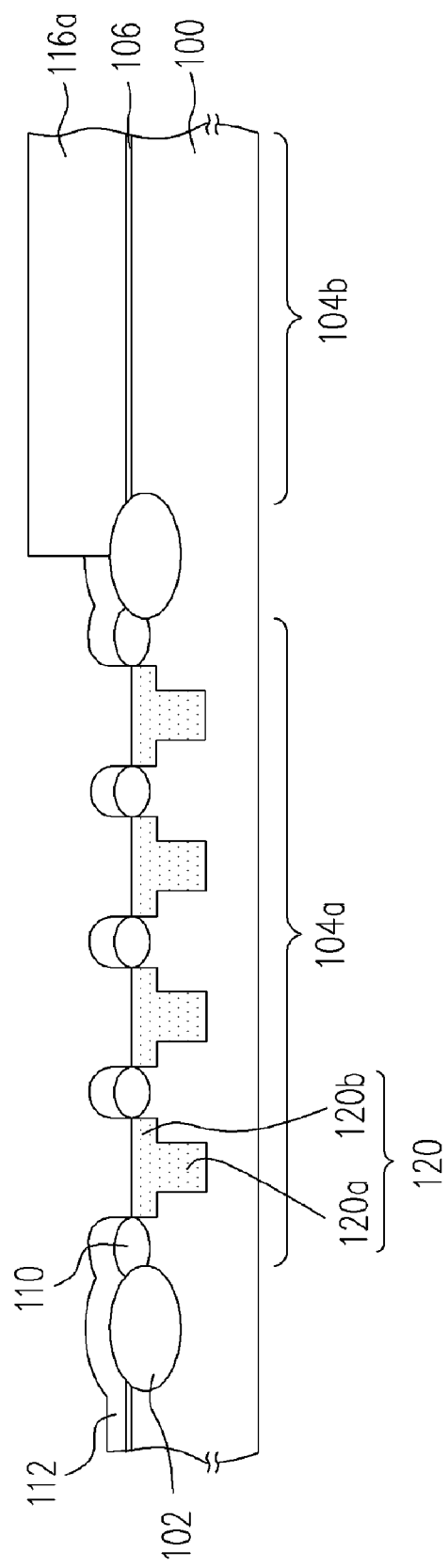

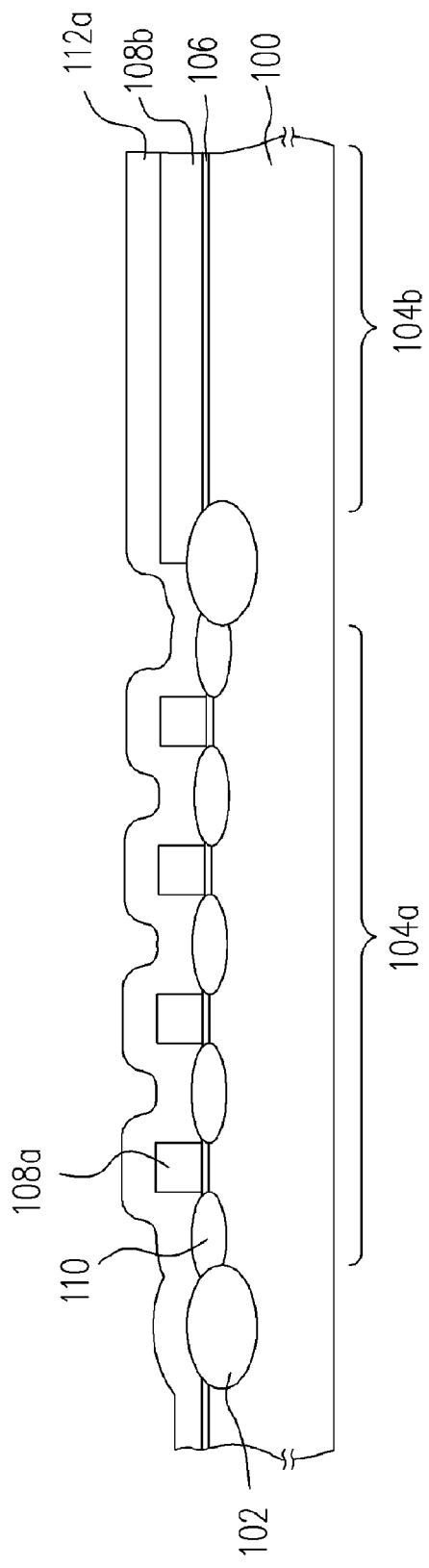
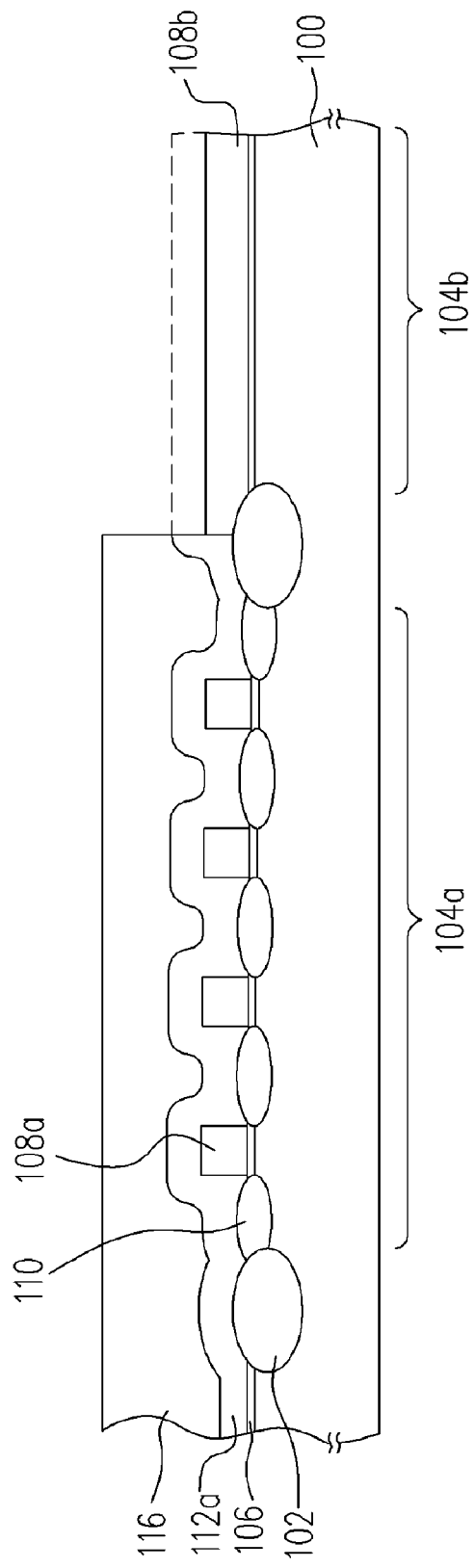
FIG. 2A
FIG. 2B

METHOD OF FABRICATING READ ONLY MEMORY AND MEMORY CELL ARRAY

BACKGROUND OF INVENTION

1. Field of the Invention

The present invention generally relates to a method of fabricating a semiconductor device. More particularly, the present invention relates to a method of fabricating a read only memory (ROM) and a memory cell array.

2. Description of Related Art

As microprocessor programming and calculating capabilities using software are being continuously enhanced are highly demanded, processes for manufacturing memory device is of great importance in semiconductor processing technology.

Generally, memory devices can be divided into volatile memory devices and non-volatile memory devices according to storage type thereof. Data stored in the volatile memory device disappears when power supply to the non-volatile memory device is removed. Hence, the volatile memory device is usually utilized to store turn-on data in a computer.

Currently, many methods of fabricating memory device are being developed for reducing memory device dimension. However, memory device size reduction causes short channel effect due to corresponding channel length reduction. One approach is to inhibit short channel effect by increasing doping concentration of channel. But, too great a doping concentration of the channel may lead to current leakage.

In order to increase the integration of memory device, the space between adjacent memory cells must be reduced. However, the space between adjacent memory cells is limited due to the limitation of lithography process.

SUMMARY OF INVENTION

Accordingly, the present invention is directed to a method of fabricating a read only memory cell array capable of increasing the channel length and the integration of memory device.

The present invention is also directed to a method of fabricating a read only memory capable of reducing the short channel effect and decreasing bit line resistance in a highly integrated memory device.

According to an embodiment of the present invention, a method of fabricating a read only memory cell array is provided. First, a patterned film is formed over the substrate for exposing a plurality of predetermined portion of the substrate. A local oxidation process is performed to form a plurality of field oxide layers on the exposed portions of the substrate. A sacrificial layer is formed over the substrate covering the field oxide layers, wherein a portion of the patterned film is exposed. The patterned film is removed to expose a plurality of portions of the substrate. Several bit lines are formed in the exposed portions of the substrate. The sacrificial layer and the local oxide layer are removed to form several recesses. A gate-insulating layer is formed over surface of the substrate and the recesses. Thereafter, word lines are formed over the gate-insulating layer.

The present invention also directed to a method of fabricating a read only memory. First, a substrate having insulating structures thereon defining a memory cell array region and a peripheral region is provided. A patterned film is formed over the substrate covering the peripheral region of the substrate and exposing a plurality of predetermined portions of the substrate in the memory cell array region. A local oxidation process is performed to form a plurality of field oxide layers on the exposed portions of the substrate in the memory cell array region. A sacrificial layer is formed over the substrate covering the field oxide layers in the memory cell array region, wherein a portion of the patterned film in the memory cell array region and a portion of the patterned film in the peripheral region are exposed. The patterned film is removed to expose a plurality of portions of the substrate. Bit lines are formed in the exposed portions of the substrate in the memory cell array region. The sacrificial layer and the field oxide layer are removed to form a plurality of recesses. A gate-insulating layer is formed on surfaces of the substrate and the recesses. A conductive layer is formed over the gate-insulating layer. The conductive layer is patterned to form word lines in the memory cell array region and at least one gate structure in the peripheral region. Thereafter, a source region/drain region is formed in the substrate beside the gate structure.

It should be noted that the field oxide layers are formed on the substrate via local oxidation process in a manner that a plurality of recesses are formed upon removal thereof in a subsequent process step. The bit lines are formed beside each of the recesses so that the regions underneath the recesses form the channels of memory cells. According to an embodiment of the present invention, the non-linear channel allows flexible adjustment of the channel length by controlling the depth of the recesses, and therefore the phenomenon of short channel effect due to further reduction in the space between the memory cells can be effectively reduced. Therefore, further increase in the integration of the memory device can be realized and the possibility of short channel effect can be effectively reduced.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A~1H are schematic cross-sectional views showing the steps of fabricating a read only memory device according to an embodiment of the present invention.

FIGS. 2A~2B are schematic cross-sectional views showing the steps of forming the sacrificial layer of FIG. 1C according to an embodiment of the present invention.

DETAILED DESCRIPTION

Figure 1A:
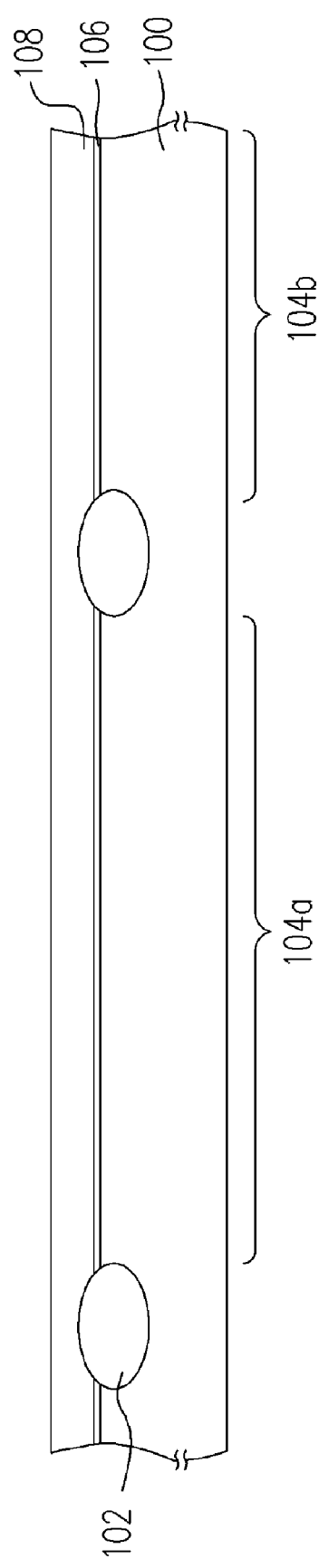

Reference will now be made in detail to the present preferred embodiments of the invention, examples of which are illustrated in the accompanying drawings. Wherever possible, the same reference numbers are used in the drawings and the description to refer to the same or like parts.

FIGS. 1A~1H are schematic cross-sectional views showing the steps of fabricating a read only memory device according to an embodiment of the present invention.

As shown in FIG. 1A, several insulating structures 102 are formed on a substrate 100 defining the substrate 100 into a memory cell array region 104*a* and a peripheral region 104*b*. The insulating structures 102 are field oxide isolation structures or shallow trench isolation structures, for example. In the FIG. 1A, the insulating structures 102 are field oxide isolation structures is illustrated as an example. Thereafter, a film 108 is formed over the substrate 100. The film 108 is a silicon nitride film, for example. In an embodiment of the present invention, before forming the film 108, a pad oxide layer 106 can be formed over the substrate 100 for protecting the surface of the substrate 100 from damage in subsequent processes, for example, etching processes.

Figure 1B:
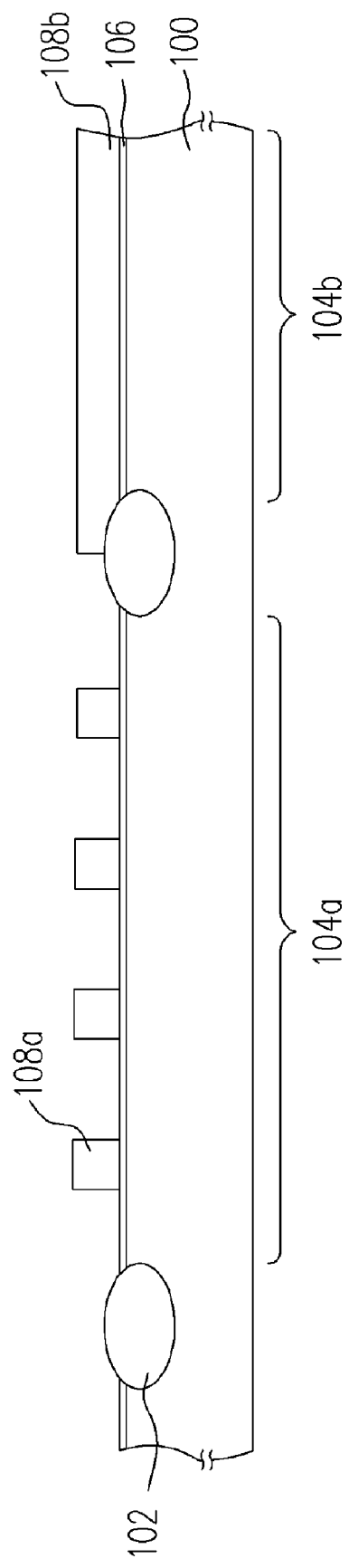

As shown in FIG. 1B, the film 108 is etched to form a patterned film 108a in the memory cell array region 104a and a patterned film 108b in the peripheral region 104b to expose predetermined portions of the substrate 100. In an embodiment of the present invention, conventional photolithography and etching process are performed for patterning the film 108.

As shown in FIG. 1C, a local oxidation process is performed to form a plurality of field oxide layers 110 on the exposed portions of the substrate 100. Especially, the field oxide layers 110 are used to define the positions of channels (not shown) of memory cells. A sacrificial layer 112 is formed over the substrate 100, a portion of the patterned film 108b in the peripheral region 104b and a portion of the patterned film 108a in the memory cell array region 104a are exposed.

In an embodiment of the present invention, the sacrificial layer 112 is formed by forming a sacrificial material layer 112a having an etching selectivity relative to the patterned film 108a, 108b over the substrate 100 (as shown in FIG. 2A) via a chemical vapor deposition process. In a case, when the patterned film 108a, 108b is a silicon nitride film, the sacrificial material layer 112a is a silicon oxide film, for example. As shown in FIG. 2B, a photoresist layer 116 is formed over the substrate 100 to cover the patterned film 108a. An etching process is performed to remove the sacrificial material layer 112a formed on the patterned film 108b by using the photoresist layer 116 as etching mask, for example, the patterned film 108b can be used as an etching stop layer during the etching operation. Thereafter, the photoresist layer 116 is removed; the sacrificial material layer 112a on the patterned film 108a is partially etched to form the sacrificial layer 112 (as shown in FIG. 1C). The sacrificial layer 112 exposes at least top corners of the patterned film 108a.

The method of forming the sacrificial layer 112 is not limited to the steps described with reference to FIG. 2A to FIG. 2B. People skilled in the art can also perform other steps or methods to fabricate the sacrificial layer 112.

As shown in FIG. 1D, an etching process is performed to remove the patterned film 108a and the patterned film 108b until portions of the substrate 100 are exposed. If the oxide layer 106 has been formed previously formed, then the pad oxide layer 106 formed on the substrate 100 is exposed at this step. According to an embodiment of the present invention, the patterned films 108a, 108b have a higher etching rate relative to the sacrificial layer 112. It should be noted that when the patterned 108a and the patterned film 108b are completely removed, the sacrificial layer 112 remain intact on the field oxide layer 110.

As shown in FIG. 1E, a photoresist layer 116a is formed over the substrate 100 to cover the peripheral region 104b. A deep implantation process is performed to form deeply doped regions 120a in the exposed portions of the substrate 100 by using the field oxide layer 110 and the sacrificial layer 112 as implanting mask.

As shown in FIG. 1F, the sacrificial layer 112 and the field oxide layer 110 are partially removed to increase the exposed area of the substrate 100. Thereafter, a shallow implantation process is performed to form shallow doped regions 120b in the substrate 100 by using the reduced field oxide layer 110a and the reduced sacrificial layer 112b as implanting mask, wherein the shallow doped regions 120b are formed beside each one of deeply doped regions 120a. The deeply doped regions 120a and the shallow doped regions 120b constitute bit lines 120 of memory cells. Wherein, the depth of the deeply doped regions 120a and the shallow doped regions 120b can be controlled by controlling the implanting energy of implantation process. According to an embodiment of the present invention, the bit lines are composed of the deeply doped regions 120a and the shallow doped regions 120b. According to another embodiment of the present invention, each of the bit lines 120 can also be composed of a single doped region. After the bit lines 120 are formed, the photoresist layer 116a is removed.

Figure 1G:
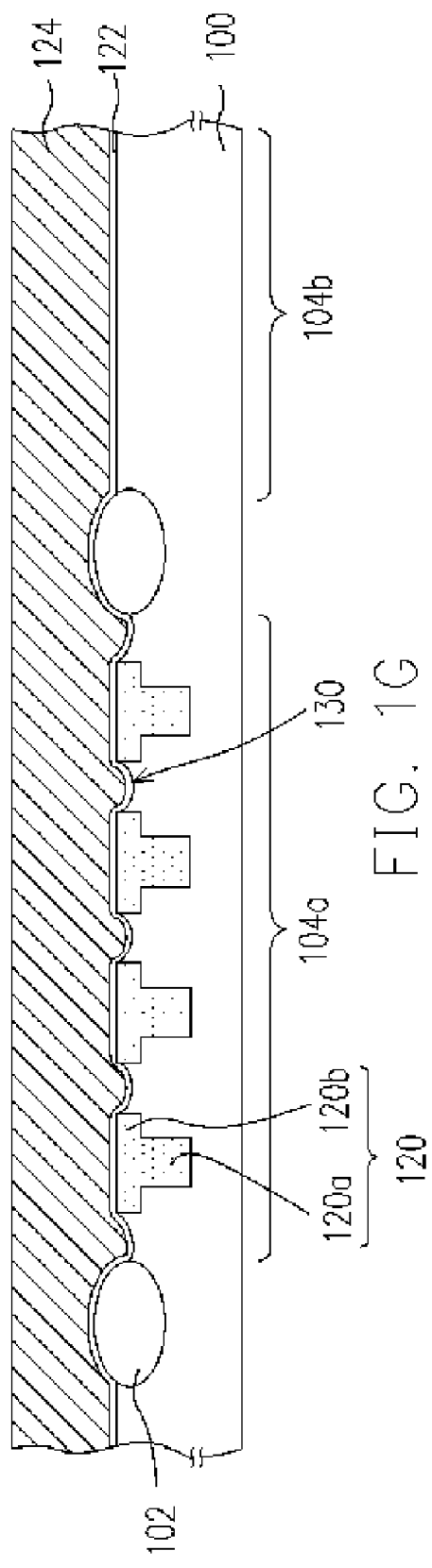

As shown in FIG. 1G, the sacrificial layer 112b and reduced field oxide layer 110a are removed using an etching process. Especially, if a pad oxide layer 106 has been formed on the substrate 100 previously, the pad oxide layer 106 is also removed during the etching process together with the sacrificial layer 112b and the reduced field oxide layer 110a. After the reduced field oxide layer 110a is removed, several recesses 130 are formed on the substrate 100. Thereafter, a gate insulating layer 122 and a conductive layer 124 are sequentially formed over the substrate 100. More particularly, the gate-insulating layer 122 is formed over the surface of the substrate 100 and the recesses 130 and the conductive layer 124 is formed over the gate insulating layer 122 filling the recesses 130. In an embodiment of the present invention, the gate-insulating layer 122 is formed by performing a thermal oxidation process, and the conductive layer 124 is formed by performing a chemical vapor deposition process.

Figure 1H:
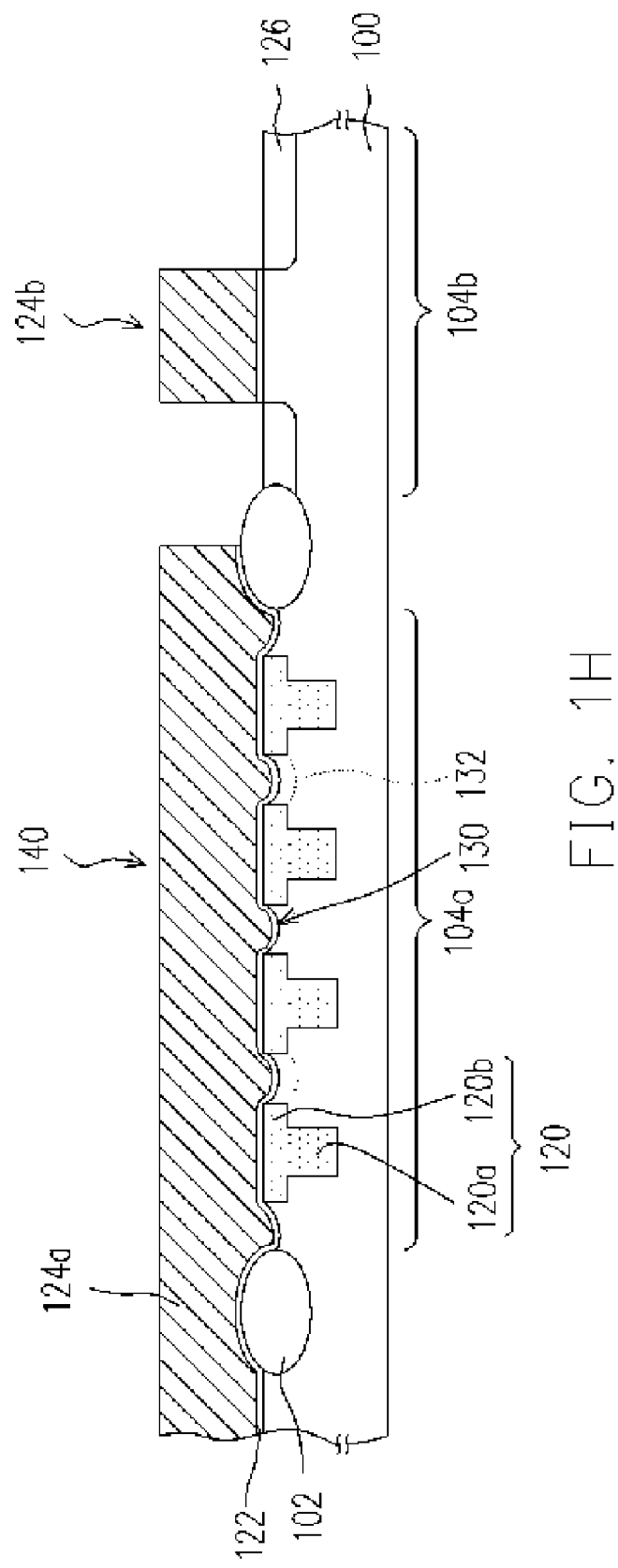

As shown in FIG. 1H, the conductive layer 124 is patterned to form at least one gate structure 124b over the peripheral region 104b and word lines 124a over the memory cell array region 104a. In the above patterning step, the gate-insulating layer 122 under the conductive layer 124 may also be patterned simultaneously. Accordingly, several memory cells are formed over the memory cell array region 104a, wherein regions 132 underneath the recesses 130 between the adjacent bit lines 120 form channels of memory cells. In addition, a source/drain region 126 is formed in the substrate 100 beside each of the gate structures 124b in the peripheral region 104b. The subsequent processes, such as, backend processes are similar to the conventional processes well known to those skilled in the art and are therefore omitted.

It should be noted, when forming the source/drain region 126, a mask layer (not shown) is formed covering the memory cell array region 104a to protect devices in the memory cell array region 104a. Besides, the gate structure, the source region and the drain region 126 may be formed using conventional MOS process, and detail description thereof is omitted.

Furthermore, a cap layer (not shown) and/or a silicide layer (not shown) may be formed over the conductive layer 124 after forming the conductive layer 124, and then these films are patterned during the step of patterning the conductive layer 124 for forming gate structures. The embodiment of the present invention described above is not limited as such.

The foregoing embodiment is described for fabricating a mask read only memory (mask ROM). It should be noted that the present invention can also be applied to fabricate a silicon nitride read only memory (NROM). Another embodiment of the invention will be described hereinafter.

Figure 3:
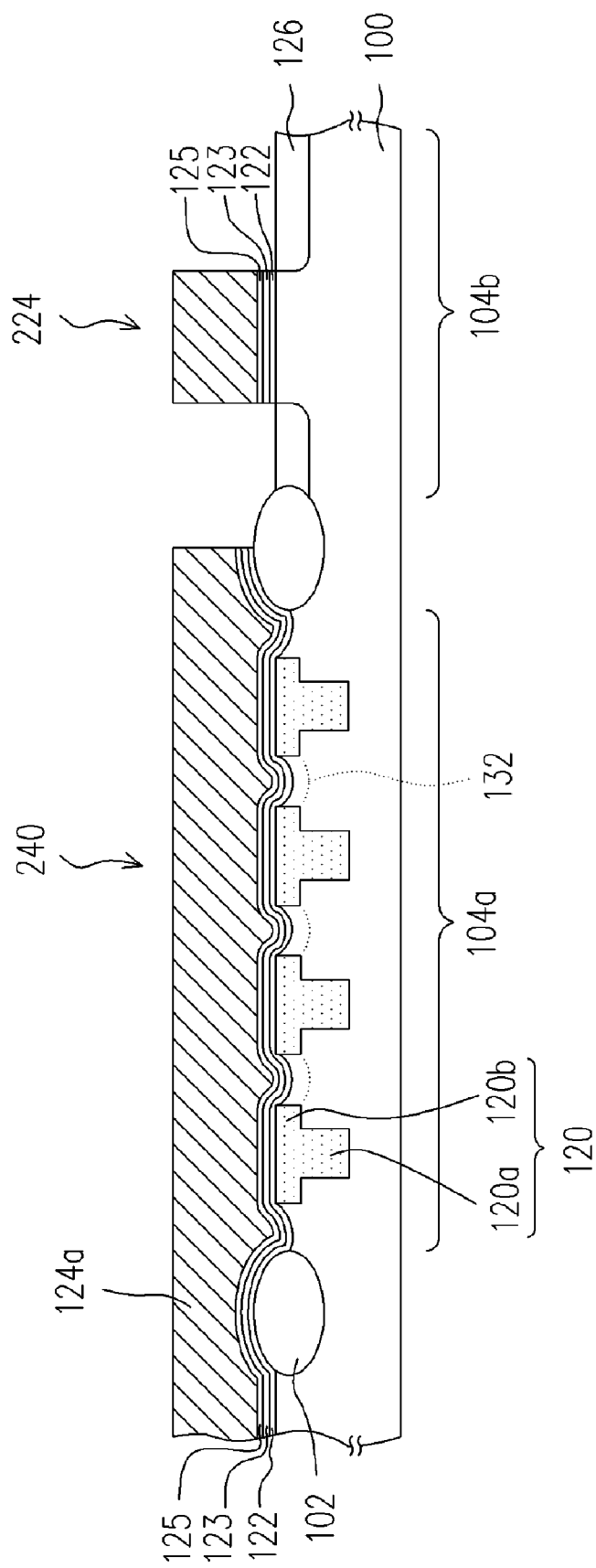
FIG. 3 is a schematic cross-sectional view showing a read only memory device according to another embodiment of the present invention.

FIG. 3 is a schematic cross-sectional view showing a read only memory device according to another embodiment of the present invention. In this embodiment of the present invention, the read only memory device can be fabricated by using the process similar to one described with reference to FIG. 1A through FIG. 1G described above, except that a silicon nitride film 123 and a barrier layer 125 are sequentially formed over the gate insulating layer 122 after forming the gate insulating layer 122 but before forming the conductive layer 124. In an embodiment of the present invention, the barrier layer 123 is a silicon oxide film, for example, and thus the gate insulating layer 122, the silicon nitride film 123 and the barrier layer 125 form a ONO (oxide-nitride-oxide) stack layer. Thereafter, the conductive layer 124 is patterned to form word lines 124a in the memory cell array region 104a and at least one gate structure 224 in the peripheral region 104b. A source/drain region 126 is formed on two sides of the gate structures 224 in the peripheral region 104b. The subsequent processes, such as, backend processes are similar to the conventional processes and therefore detail description thereof are omitted herein.

For increasing the integration of the memory device, the bit line width must be reduced however channel length must be large enough to prevent short channel effect. In the present invention, the patterned film is used to define the positions of bit lines, and the field oxide layer formed in the regions exposed by patterned film is used to define the positions of channels and therefore, it is possible to fabricate bit lines with smaller width and also channels that are large enough to reduce short channel effect. In other words, is the width of the bit lines and the channel length are not limited by the limitation of lithography process. Therefore, the integration of the memory device can be further increased.

Moreover, the field oxide layer with a particular shape is formed via local oxidation process in a manner that the recesses are formed on the substrate upon removal of the field oxide layer. The bit lines are formed beside each of the recesses, and the regions underneath these recesses form channels of the memory cells, which are non-linear in contrast to conventional channel that are linear channels. Accordingly, the non-linear channel, according to an embodiment of the present invention, allows flexible adjustment of the channel length by controlling the depth of the recesses, and therefore the phenomenon of short channel effect due to further reduction in the space between the memory cells can be effectively reduced. Therefore, further increase in the integration of the memory device can be realized and the possibility of short channel effect can be effectively reduced.

Furthermore, the bit lines are composed of a deeply doped region and a shallow doped region and therefore the resistance of the bit line can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a memory cell array, comprising:
   forming a patterned film over a substrate exposing portions of the substrate;
   performing a local oxidation process to form a field oxide layer on the exposed portions of the substrate;
   forming a sacrificial layer over the substrate covering the field oxide layer, wherein a plurality of portions of the patterned film are exposed;
   removing the patterned film to expose another portions of the substrate;
   forming a plurality of bit lines in the another exposed portions of the substrate;
   removing the sacrificial layer and the field oxide layer to form a plurality of recesses;
   forming a gate insulating layer over the substrate and the recesses; and
   forming a plurality of word lines over the gate insulating layer.

2. The method of claim 1, wherein the sacrificial layer has an etching selectivity relative to the patterned film.

3. The method of claim 2, wherein the patterned film is a silicon nitride film and the sacrificial layer is a silicon oxide film.

4. The method of claim 1, wherein the step of forming the sacrificial layer comprises:
   forming a sacrificial material layer over the substrate covering the patterned film and the field oxide layer; and
   partially removing the sacrificial material layer such that the a plurality of portions of patterned film are exposed.

5. The method of claim 1, wherein the step of forming the bit lines comprises:
   performing a deep implantation process to form a plurality of deeply doped regions in the substrate by using the field oxide layer and the sacrificial layer as implanting mask;
   removing the field oxide layer and the sacrificial layer partially to increase an area of the another exposed portions of the substrate; and
   performing a shallow implantation process to form a shallow doped region beside each of the deeply doped regions.

6. The method of claim 1, further comprising a step of sequentially forming a silicon nitride layer and a barrier layer sequentially and a step of forming the word lines to form a silicon nitride read only memory (NROM) after the step of forming the gate insulating layer.

7. The method of claim 1, further comprising a step of forming a pad oxide layer over the substrate before the step of forming the patterned film over the substrate, and a step of removing the pad oxide layer during the step of removing the sacrificial layer and the field oxide layer.

8. A method of fabricating a read only memory, comprising:
   providing a substrate having insulating structures thereon defining the substrate into a memory cell array region and a peripheral region;
   forming a patterned film over the substrate for exposing portions of the substrate in the memory cell array region and covering the substrate in the peripheral region;
   performing a local oxidation process to form a field oxide layer on the exposed portions of the substrate in the memory cell array region;
   forming a sacrificial layer over the substrate covering the field oxide layer in the memory cell array region, wherein a plurality of portions of the patterned film in the memory cell array region and the patterned film in the peripheral region are exposed;
   removing the patterned film to expose another portions of the substrate;
   forming a plurality of bit lines in the another exposed portions of the substrate in the memory cell array region;
   removing the sacrificial layer and the field oxide layer to form a plurality of recesses in the substrate in the memory cell array region;
   forming a gate insulating layer on surfaces of the substrate and the recesses;

forming a conductive layer over the gate insulating layer;

patterning the conductive layer to form a plurality of word lines in the memory cell array region and at least one gate structure in the peripheral region;

forming a source region and a drain region in the substrate beside each one of the gate structure.

9. The method of claim 8, wherein the sacrificial layer has an etching selectivity relative to the patterned film.

10. The method of claim 9, wherein the patterned film is a silicon nitride film and the sacrificial layer is a silicon oxide film.

11. The method of claim 8, wherein the step of forming the sacrificial layer comprises:

forming a sacrificial material layer over the substrate covering the patterned film and the field oxide layer;

removing the sacrificial material layer in the peripheral region to expose the patterned film in the peripheral region; and partially removing the sacrificial material layer in the memory cell array region such that the a plurality of portions of patterned film in the memory cell array region are exposed.

12. The method of claim 8, wherein the step of forming the bit lines comprises:

forming a patterned photoresist layer over the substrate covering the substrate of the peripheral region;

performing an implantation process by using the patterned photoresist layer, the field oxide layer and the sacrificial layer as an implanting mask; and removing the patterned photoresist layer.

13. The method of claim 8, wherein the step of forming the bit lines comprises:

forming a patterned photoresist layer over the substrate covering the substrate of the peripheral region;

performing a deep implantation process to form a plurality of deeply doped regions in the substrate by using the patterned photoresist layer, the field oxide layer and the sacrificial layer as an implanting mask;

partially removing the field oxide layer and the sacrificial layer partially to increase an area of the another exposed portions of the substrate; and performing a shallow implantation process to form a shallow doped region beside each of the deeply doped regions; and removing the patterned photoresist layer.

14. The method of claim 8, further comprising a step of sequentially forming a silicon nitride layer and a barrier layer on the gate insulating layer in the memory cell array region and a step of forming the word lines to form a silicon nitride read only memory (NROM) array after the step of forming the gate insulating layer.

15. The method of claim 8, farther comprising a step of forming a pad oxide layer over the substrate before the step of forming the patterned film over the substrate, wherein the pad oxide layer is removed during the step of removing the sacrificial layer and the field oxide layer.

16. The method of claim 8, wherein the insulating structures comprise field oxide insulating structures or shallow trench isolation structures.

* * * * *